(12) United States Patent

Nakagawa

(10) Patent No.: US 12,619,810 B2

(45) Date of Patent: May 5, 2026

(54) CHIP STRUCTURE WITH STEGANOGRAPHIC FILL SHAPE PATTERN

(71) Applicant: GlobalFoundries U.S. Inc., Malta, NY (US)

(72) Inventor: Osamu S. Nakagawa, Redwood City, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 718 days.

(21) Appl. No.: 18/152,707

(22) Filed: Jan. 10, 2023

(65) Prior Publication Data

US 2024/0232484 A1 Jul. 11, 2024

(51) Int. Cl.
| | |
|---|---|
| *G06F 30/30* | (2020.01) |
| *G06F 30/33* | (2020.01) |
| *G06F 30/392* | (2020.01) |
| *H10W 42/40* | (2026.01) |

(52) U.S. Cl.
CPC ............ *G06F 30/33* (2020.01); *G06F 30/392* (2020.01); *H10W 42/40* (2026.01)

(58) Field of Classification Search
None
See application file for complete search history.

(56) References Cited

U.S. PATENT DOCUMENTS

| | | | |
|---|---|---|---|
| 8,266,571 B2 | 9/2012 | Chapman et al. | |
| 9,819,660 B2 | 11/2017 | Tredoux et al. | |
| 11,090,966 B2 * | 8/2021 | King | H04N 1/14 |
| 2021/0192018 A1 * | 6/2021 | Bhunia | G06F 21/76 |
| 2024/0028813 A1 * | 1/2024 | Jou | G06F 30/333 |

OTHER PUBLICATIONS

T. Filler et al., "Complete Characterization of Perfectly Secure Stego-Systems with Mutually Independent Embedding Operation," ICASSP 2009, IEEE, pp. 1429-1432. (Year: 2009).*

(Continued)

*Primary Examiner* — Leigh M Garbowski

(74) *Attorney, Agent, or Firm* — David Cain; Hoffman Warnick LLC

(57) ABSTRACT

A disclosed chip structure includes a coded pattern of dummy fill shapes with steganographically embedded information. The coded pattern is in a specific area of the chip, is a modified instance of a known pattern, and is decodable into a binary integer based on observable differences between the coded pattern and the known pattern at corresponding locations with the patterns. The location of the specific area containing the coded pattern, the decode cipher and the binary integer can be maintained as proprietary information (e.g., by a technology company or semiconductor foundry). Chip authentication can be made by a party with the proprietary information. Alternatively, the binary integer could be a means of conveying confidential information to a party that has been provided with the decode cipher and the location of the specific area containing the coded pattern. Also disclosed are system and method embodiments for designing and manufacturing the chip.

20 Claims, 10 Drawing Sheets

(56)  References Cited

OTHER PUBLICATIONS

He et al., "EM-Based on-Chip Aging Sensor for Detection and Prevention of Counterfeit and Recycled ICs," Nov. 2015 IEEE/ACM International Conference on Computer-Aided Design (ICCAD), pp. 146-151.

Mohd et al., "FPGA Hardware of the LSB Steganography Method," May 2012, IEEE International Conference on Computer Information and Telecommunication Systems, pp. 1-4.

Sengupta et al., "Hardware Steganography for IP Core Protection of Fault Secured DSP Cores," Sep. 2019, IEEE 9th International Conference on Consumer Electronics (ICCE—Berlin), pp. 1-6.

Anonymous, "Global Chip Shortage Spurs a Rise in Counterfeit Components," Area51 Electronics, published Aug. 4, 2022, retrieved from: https://area51esg.com/global-chip-shortage-spurs-a-rise-in-counterfeit-components/ on Nov. 15, 2022, 2 pages.

Pangavhane et al., "FPGA implementation of LSB Steganograpgy method," IOSR Journal of Electronics and Communication Engineering (IOSR-JECE), downloaded from: www.iosrjournals.org on Nov. 15, 2022, pp. 10-14.

* cited by examiner

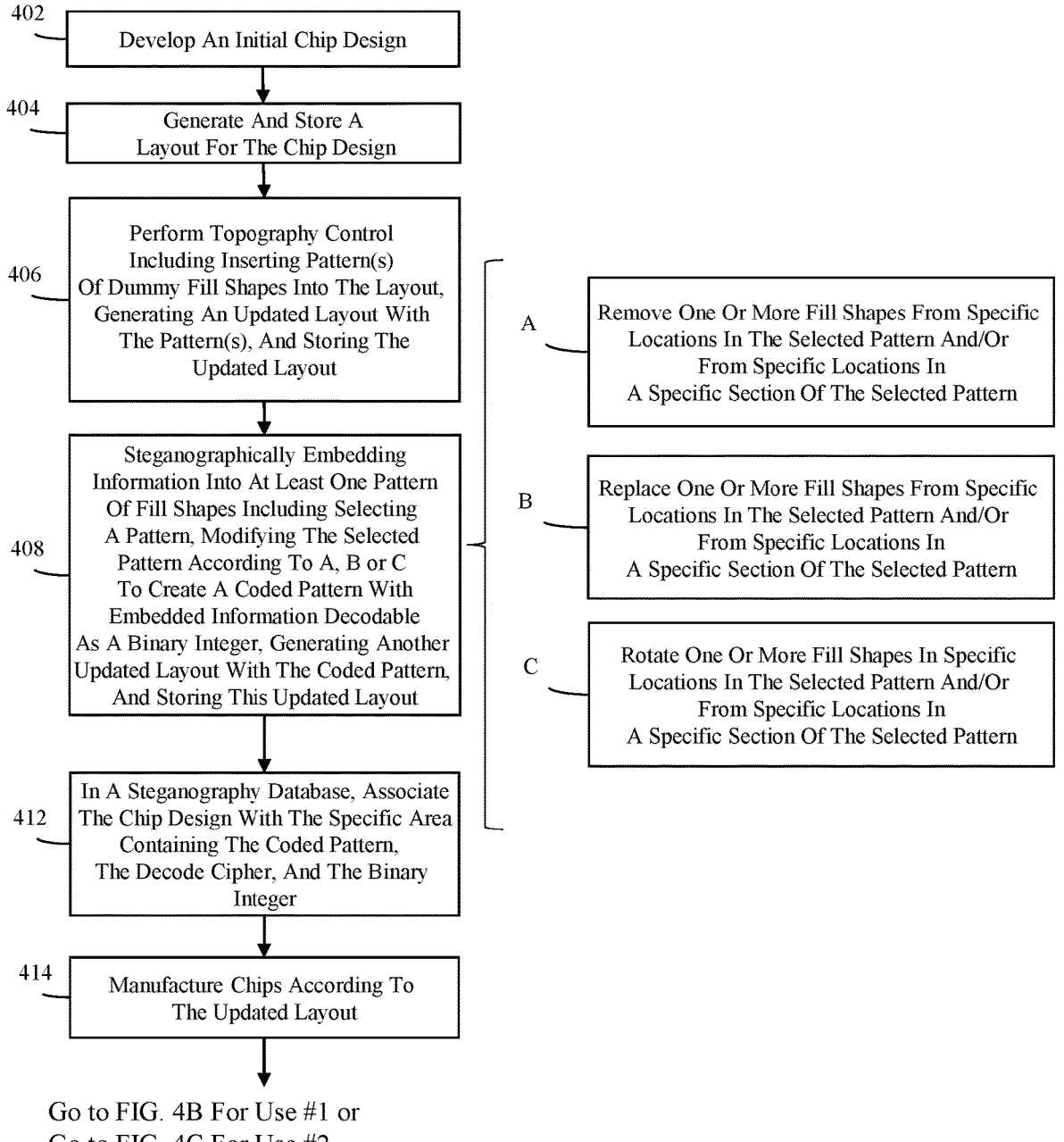

402   Develop An Initial Chip Design

404   Generate And Store A
Layout For The Chip Design

406   Perform Topography Control
Including Inserting Pattern(s)
Of Dummy Fill Shapes Into The Layout,
Generating An Updated Layout With
The Pattern(s), And Storing The
Updated Layout A   Remove One Or More Fill Shapes From Specific
Locations In The Selected Pattern And/Or
From Specific Locations In
A Specific Section Of The Selected Pattern 408   Steganographically Embedding
Information Into At Least One Pattern
Of Fill Shapes Including Selecting
A Pattern, Modifying The Selected
Pattern According To A, B or C
To Create A Coded Pattern With
Embedded Information Decodable
As A Binary Integer, Generating Another
Updated Layout With The Coded Pattern,
And Storing This Updated Layout B   Replace One Or More Fill Shapes From Specific
Locations In The Selected Pattern And/Or
From Specific Locations In
A Specific Section Of The Selected Pattern C   Rotate One Or More Fill Shapes In Specific
Locations In The Selected Pattern And/Or
From Specific Locations In
A Specific Section Of The Selected Pattern 412   In A Steganography Database, Associate
The Chip Design With The Specific Area
Containing The Coded Pattern,
The Decode Cipher, And The Binary
Integer 414   Manufacture Chips According To
The Updated Layout Go to FIG. 4B For Use #1 or
Go to FIG. 4C For Use #2.

FIG. 4A

Use #2

From FIG. 4A

460   Receive A Chip Purported To Be Manufactured According To The Design

462   Receive Indications Of The Specific Area And Decode Instructions

464   Observe The Specific Area

466   Decode To Determine The Binary Integer And Use

CHIP STRUCTURE WITH STEGANOGRAPHIC FILL SHAPE PATTERN

BACKGROUND

The present disclosure relates to semiconductor chips and, more particularly, to embodiments of a semiconductor chip structure with steganographic features and to system and method embodiments for designing, manufacturing, and using chip structures with such steganographic features.

Technology companies and semiconductor foundries (also referred to as semiconductor fabrication plants or fabs) are continuously trying to find ways to thwart chip counterfeiters. The influx of counterfeit chips into the tech market results in lost revenues. Additionally, because such counterfeit chips are not typically subjected to the same quality controls, they are inevitably sub-standard. Sub-standard chips can lead to poor performance or even failures under normal operating conditions and, depending upon the particular application, can also lead to product safety issues. Thus, the negative impacts of counterfeit chips can include irreparable harm to a company's profits and reputation and also to potential legal liabilities (e.g., if authentic chips are not readily distinguishable from counterfeit chips). Various chip authentication techniques have been developed in an attempt to ensure chip authenticity. Typically, these techniques require on-chip functional components (e.g., e-fuses) and electrical sensing of such components. However, these authentication techniques may not be sufficiently secure to protect against particularly good counterfeits. Additionally, the results of electrical sensing used for authentication may be considered weak evidence during litigation.

SUMMARY

Disclosed herein are embodiments of a chip structure. The chip structure can include a substrate. The chip structure can also include patterns of fill shapes on the substrate. These patterns of fill shapes can include at least one coded pattern of fill shapes that has steganographically embedded information. This coded pattern can, for example, be decodable into a binary integer as a function of observable differences between it and a known pattern.

Also disclosed herein are associated method embodiments. One method embodiment can include accessing a layout of a chip. The layout can further be updated to include patterns of fill shapes, where the patterns of fill shapes in the updated layout include at least one coded pattern with steganographically embedded information so that chips manufactured according to the updated layout include the at least one coded pattern. Another method embodiment can include inspecting a coded pattern of fill shapes in a specific area of a chip. This coded pattern can specifically include steganographically embedded information. The method can further include, based on the results of the inspection, decoding the coded pattern into a binary integer.

BRIEF DESCRIPTION OF THE DRAWINGS

The present disclosure will be better understood from the following detailed description with reference to the drawings, which are not necessarily drawn to scale and in which:

FIGS. 4A-4C are flow diagrams illustrating associated method embodiments for designing, manufacturing and using the disclosed chip structure embodiments;

DETAILED DESCRIPTION

Figure 1:
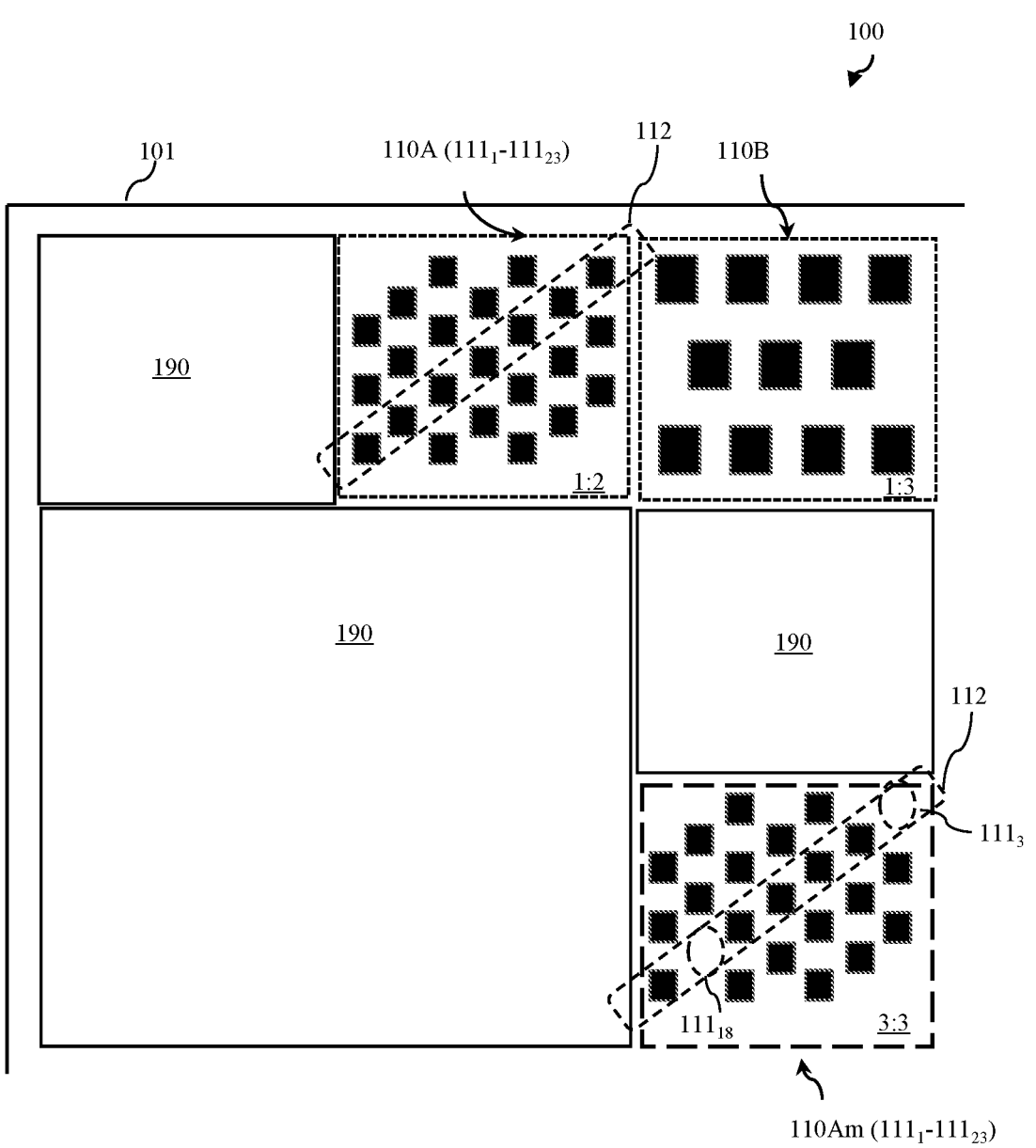
FIG. 1 is a layout diagram illustrating disclosed embodiments of a chip structure.

As mentioned above, technology companies and semiconductor foundries are continuously trying to find ways to thwart chip counterfeiters. The influx of counterfeit chips into the tech market results in lost revenues. Additionally, because such counterfeit chips are not typically subjected to the same quality controls, they are inevitably sub-standard. Sub-standard chips can lead to poor performance or even failures under normal operating conditions and, depending upon the particular application, can also lead to product safety issues. Thus, the negative impacts of counterfeit chips can include irreparable harm to a company's profits and reputation and also to potential legal liabilities (e.g., if authentic chips are not readily distinguishable from counterfeit chips). Various chip authentication techniques have been developed in an attempt to ensure chip authenticity. Typically, these techniques require on-chip functional components (e.g., e-fuses) and electrical sensing of such components. However, these authentication techniques may not be sufficiently secure to protect against particularly good counterfeits. Additionally, the results of electrical sensing used for authentication may be considered weak evidence during litigation.

In view of the foregoing, disclosed herein are embodiments of a semiconductor chip structure including passive steganographic features and, particularly, including a coded pattern of dummy fill shapes with steganographically embedded information. Specifically, the coded pattern of dummy fill shapes can be in a specific area of the chip and can be a modified instance of a known pattern of dummy fill shapes (e.g., either a pattern previously stored in a library or a customized pattern). Such a coded pattern can be decodable into a binary integer as a function of observable differences between the coded pattern and the known pattern at corresponding locations. The location of the specific area containing the coded pattern, the decode cipher and the binary integer can be maintained as proprietary information (e.g., by a technology company or semiconductor foundry). Chip authentication can be made by a party with that proprietary information. For example, chip authentication can be made based on both the presence of a coded pattern in the specific area of the chip as well as the accuracy of the decoded binary integer (i.e., does it match the expected binary integer that functions as a chip identifier). Alternatively, the binary integer could be a means of conveying some confidential information to a party that has been provided with the decode cipher and the location of the specific area on the chip that includes the coded pattern. Also disclosed herein are system and method embodiments for designing and manufacturing such a chip structure.

"Steganographically embedded information" refers to secret information that is hidden within something else that is ordinary and non-secret and that is further hidden in such a way that it cannot be detected without having a decode cipher. Oftentimes, such steganographically embedded information is hidden within a message or file or printed pattern (e.g., a barcode or Q-code). In the disclosed chip structure embodiments and associated method embodiments, the steganographically embedded information is specifically hidden within a coded pattern of fill shapes, as discussed in greater detail below.

Figure 2:
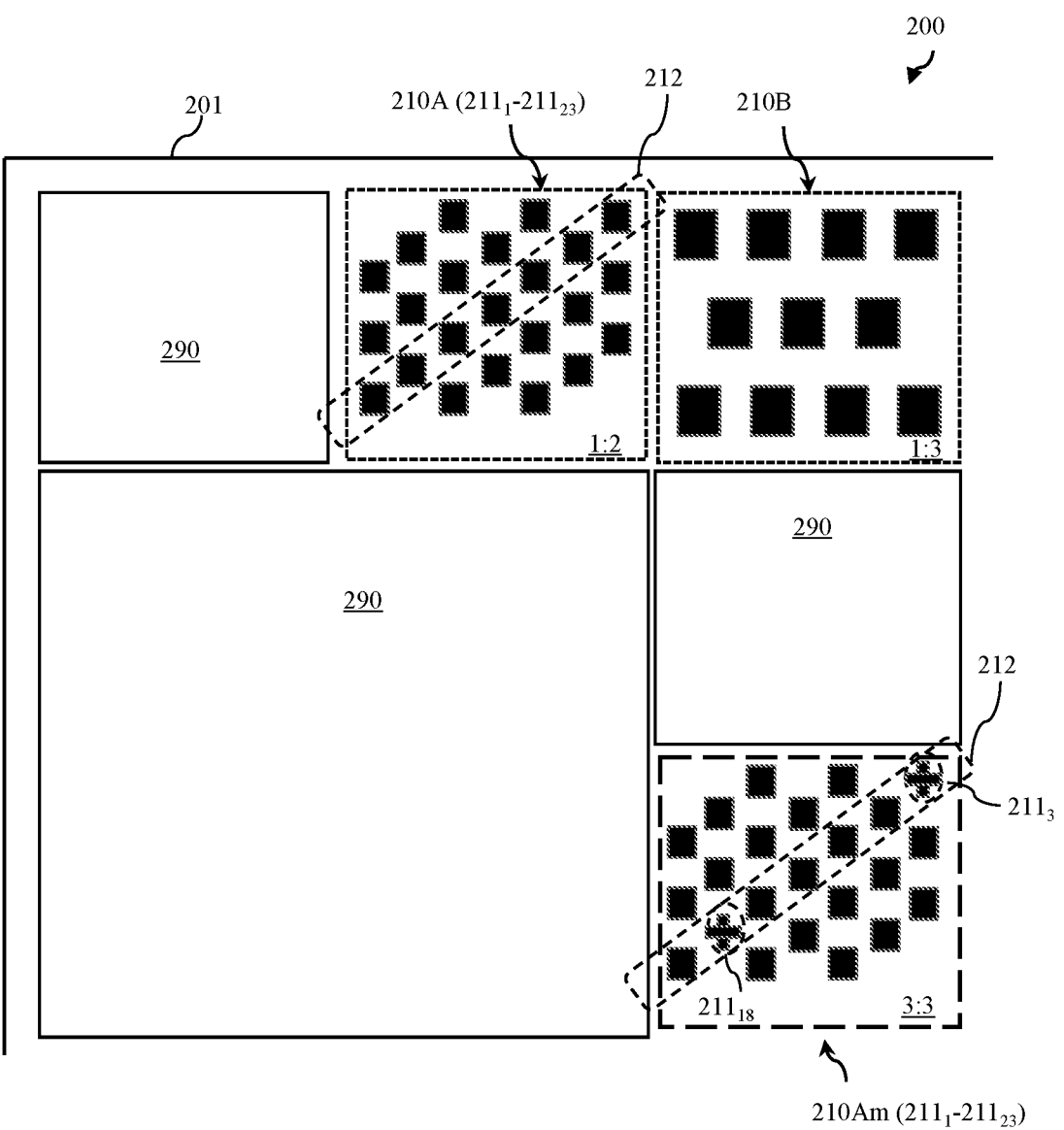
FIG. 2 is a layout diagram illustrating other disclosed embodiments of a chip structure.
Figure 3:
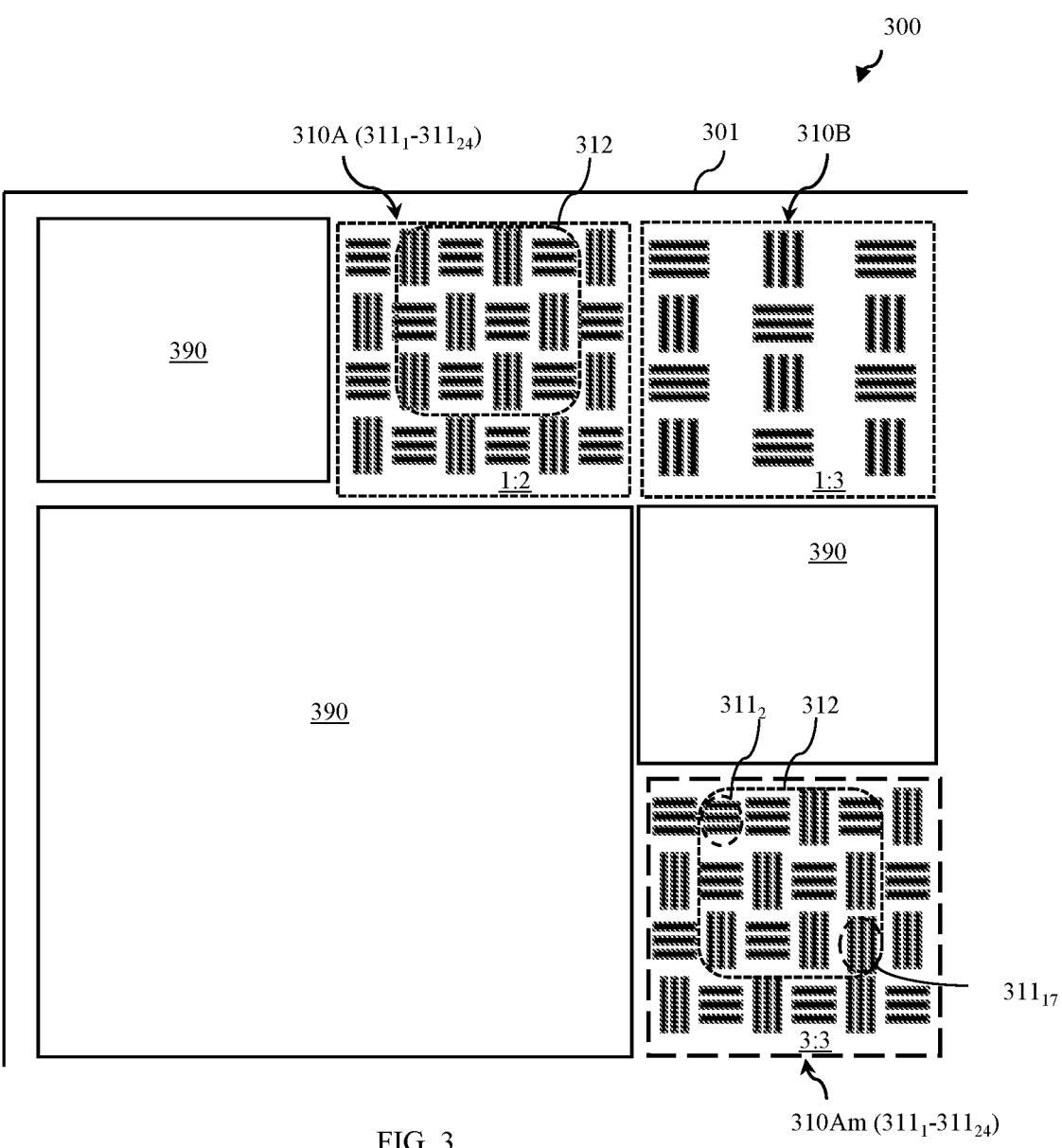
FIG. 3 is a layout diagram illustrating still other disclosed embodiments of a chip structure.

More particularly, FIGS. 1, 2 and 3 are layout diagrams illustrating embodiments of a semiconductor chip structure 100, 200, and 300, respectively. The chip structure 100, 200, 300 can be any known type of chip structure. For example, it could be a semiconductor-on-insulator (e.g., silicon-on-insulator (SOI)) chip structure, a bulk semiconductor (e.g., bulk silicon) chip structure, a hybrid chip structure (which includes both semiconductor-on-insulator and bulk semiconductor regions), etc. Furthermore, the semiconductor chip structure can be an integrated circuit (IC) chip, a photonic integrated circuit (PIC) chip, etc.

In any case, the chip structure 100, 200, 300 can include a substrate 101, 201, 301 (e.g., a semiconductor substrate or a substrate of some other suitable chip substrate material). Like other chip structures, the chip structure 100, 200, 300 can include front end of the line (FEOL) devices above the substrate 101, 201, 301. Those skilled in the art will recognize that such FEOL devices will be application-specific and could include microelectronic devices, optoelectronic devices and/or photonic devices. The chip structure 100, 200, 300 can further include middle of the line (MOL) components including, but not limited to, one or more MOL dielectric layers stacked above the FEOL devices and MOL contacts extending through the MOL dielectric layers to at least some of the FEOL devices. The chip structure 100, 200, 300 can further include back end of the line (BEOL) metal levels above the MOL components. The BEOL metal levels can include, but are not limited to, layers of interlayer dielectric (ILD) material and interconnects (e.g., wires and/or vias) for providing electronic connections between on chip devices and/or with off-chip components. FEOL, MOL and BEOL chip features are well known in the art. Thus, the details of these features have been omitted from the specification to allow the reader to focus on the salient aspects of the disclosed embodiments. Furthermore, they have been omitted from the figures to avoid clutter and, again, to allow the reader to focus on the salient aspects of the disclosed embodiments.

The chip structure 100, 200, 300 can further include one or more patterns of fill shapes above the substrate 101, 201, 301 and these pattern(s) of fill shapes can include at least one coded pattern with steganographically embedded information in a specific area, as discussed in greater detail below. The coded pattern can specifically be a modified instance of some known pattern. Additionally, the coded pattern can be decodable into a binary integer as a function of observable differences between the coded pattern and that known pattern at corresponding locations in the two patterns. It should be understood that observable differences include differences between the coded pattern and the known pattern that are at least observable through inspection by a scanning electron microscope (SEM).

For purposes of this disclosure, a pattern of fill shapes (also referred to herein as a pattern of dummy fill shapes) refers to a pattern of non-functional fill shapes in the BEOL metal levels. Typically, the fill shapes will be metallic fill shapes in a dielectric layer, where the dielectric layer includes one or more layers of dielectric material (e.g., a thin layer of etch stop material and a thick layer of interlayer dielectric material). For example, trenches or openings can be formed (e.g., lithographically patterned and etched) in the dielectric layer to have the desired shape and pattern. The trenches/openings can then be filled with one or more layers of metal or metal alloy materials. These metal or metal alloy materials can include, for example, a metallic barrier and/or adhesive liner and a metallic fill material on the liner. In some embodiments, the metal or metal alloy materials can include an adhesion layer (e.g., titanium, titanium nitride, tantalum, or any other suitable adhesion layer), a diffusion barrier layer (e.g., a Noble Metal layer or some other suitable diffusion barrier material layer), and a copper fill material. The fill shapes can further be covered by dielectric material and electrically isolated from other BEOL components (e.g., wires and/or vias) so that they are non-functional (i.e., dummy) features that do not provide electrical connections between on-chip components or electrical connections to off-chip components. Alternatively, the fill shapes could include any other suitable metal or metal alloy materials in a dielectric layer (e.g., essentially the same metal or metal alloy materials used in BEOL metal wiring used for on-die and die-to-die electrical connections). Alternatively, the fill shapes in a pattern of fill shapes could include dielectric fill shapes formed in a metallic layer (e.g., metallic wire or plate) that is electrically isolated from other BEOL components such that it is non-functional.

Those skilled in the art will recognize that patterns of fill shapes are typically inserted into the layout of a chip design for topography control purposes. Specifically, during processing of any given BEOL metal level, different ratios of metal-to-dielectric material in different areas of a layer subjected to chemical mechanical polishing (CMP) will result in across-chip thickness variations in that layer. Topography control refers to a design process where CMP simulation is performed on a layer given any areas 190, 290, 390 within that layer containing metal or metal alloy interconnects (e.g., wires and/or vias). Given the results of this CMP simulation, patterns of fill shapes are then selected and/or customized and inserted into the layout to achieve an approximately uniform across-chip metal density within the layer and thereby achieve an approximately uniform across-chip thickness. Different patterns of fills shapes may be used in different areas depending, for example, on the density of the metal or metal alloy interconnects in the adjacent areas 190, 290, 390. The different patterns can have different densities, different fill shapes, different fill shape sizes, different pattern arrangements, etc.

For purposes of illustration, each chip structure 100, 200, 300 is shown in the figures as including three patterns of fill shapes, one of which is a coded pattern of fill shapes and particularly a modified instance of one of the other two patterns. Alternatively, the disclosed chip structure could include any other number of one or more patterns of fill shapes, as long as one of the patterns of fill shapes is a coded pattern that is a modified instance of a known pattern. It should be understood that the coded pattern of fill shapes could, for example (and as illustrated) be a modified instance of one of the other patterns of fill shapes included on the chip. Alternatively, the coded pattern of fill shapes could be a modified instances of some other pattern of fill shapes that is known but not included on the chip (e.g., a known pattern of fill shapes selectable from a fill shape pattern library in a process design kit (PDK) or previously customized). The modified instance of a known pattern can, for example, be modified by removing one or more fill shapes from one or more locations within the pattern, by replacing the fill shapes from one or more locations within the pattern (e.g., with a fill shape of a different shape and/or size and/or material), by changing the orientation (e.g., by rotating) one or more of the fill shapes in one or more locations within the pattern, or by otherwise altering the pattern. In any event, the modified instance of the known pattern is decodable, as discussed in greater detail below, into a binary integer based on observable differences between the coded pattern and that known pattern at corresponding locations in the two patterns.

For example, chip structure 100 of FIG. 1 includes a first pattern 110A of fill shapes in a first area (e.g., as indicated by some defined coordinates, in this example 1:2), a second pattern 110B of fill shapes in a second area (e.g., as indicated by some defined coordinates, in this example 1:3), and a coded pattern 110Am of fill shapes in a third area (e.g., as indicated by some defined coordinates, in this example 3:3). For purposes of illustration, the fill shapes in the first pattern 110A and the fill shapes in the second pattern 110B are shown as having essentially the same shape (e.g., square or rectangle), but different sizes and densities (i.e., different numbers of fill shapes per unit area). The coded pattern 110Am is a modified instance of the first pattern 110A. Specifically, as illustrated, the first pattern 110A has a particular arrangement of twenty-three fill shapes at locations $111_1$-$111_{23}$. The coded pattern 110Am is a modified instance of this first pattern 110A in that it has essentially the same particular arrangement of fill shapes except that some of the fill shapes at some locations (e.g., see locations $111_3$ and $111_{18}$) have been removed as compared to fill shapes at the corresponding locations in the first pattern 110A.

The coded pattern 110Am can be decodable into a binary integer based on differences between the coded pattern 110A and that known pattern 110A at the corresponding locations $111_3$ and $111_{18}$ in the two patterns. For example, in some embodiments, each fill shape location $111_1$-$111_{23}$ in the known pattern 110A can be associated with a different bit position in the binary integer. Thus, within the coded pattern 110Am and as compared to corresponding locations within the known pattern 110A, unmodified and modified fill shape locations can be associated with first and second data values, respectively. That is, all fill shape locations within the coded pattern 110Am except for the modified fill shape locations $111_3$ and $111_{18}$ (which are devoid of fill shapes) can be associated with a first data value (e.g., 0) and the modified fill shape locations $111_3$ and $111_{18}$ (again which are devoid of fill shapes) can be associated with a second data value (e.g., 1). In this case, the coded pattern 110Am is decodable into a binary integer with twenty-three bit positions and, particularly, into the following binary integer [00100000000000001000000]. In other embodiments, each fill shape location within a specific section (e.g., see section 112) in the known pattern 110A can be associated with a different bit position in the binary integer. Thus, within this same section 112 in the coded pattern 110Am and as compared to corresponding locations within the known pattern 110A, unmodified and modified fill shape locations can be associated with first and second data values, respectively. That is, all fill shape locations with the section 112 in the coded pattern 110Am except for the modified fill shape locations $111_3$ and $111_{18}$ (which are devoid of fill shapes) can be associated with a first data value (e.g., 0) and the modified fill shape locations $111_3$ and $111_{18}$ (again which are devoid of fill shapes) can be associated with a second data value (e.g., 1). In this case, the coded pattern 110Am is decodable into a binary integer with seven bit positions and, particularly, into the following binary integer [0100001].

Also, for example, chip structure 200 of FIG. 2 includes a first pattern 210A of fill shapes in a first area (e.g., as indicated by coordinates 1:2), a second pattern 210B of fill shapes in a second area (e.g., as indicated by coordinates 1:3) and a coded pattern 210Am of fill shapes in a third area (e.g., as indicated by coordinates 3:3). For purposes of illustration, the fill shapes in the first pattern 210A and the fill shapes in the second pattern 210B are shown as having essentially the same shape (e.g., square or rectangle), but different sizes and densities (i.e., different numbers of fill shapes per unit area). The coded pattern 210Am is a modified instance of the first pattern 210A. Specifically, as illustrated, the first pattern 210A has a particular arrangement of twenty-three fill shapes at locations $211_1$-$211_{23}$. The coded pattern 210Am is a modified instance of this first pattern 210A in that it has essentially the same particular arrangement of fill shapes except that some of the fill shapes at some locations (e.g., see locations $211_3$ and $211_{18}$) have been replaced with different fill shapes as compared to the fill shapes at the corresponding locations in the first pattern 210A. In this example, the replacement fill shapes are cross-shapes as opposed to being rectangular in shape. It should be understood that the replacement fill shapes could be any other replacement fill shape with a different shape and/or different size and/or different material as compared to the fill shape at the same location within the known pattern.

The coded pattern 210Am can be decodable into a binary integer based on differences between the coded pattern 210A and that known pattern 210A at the corresponding locations $211_3$ and $211_{18}$ in the two patterns. For example, in some embodiments, each fill shape location $211_1$-$211_{23}$ in the known pattern 210A can be associated with a different bit position in the binary integer. Thus, within the coded pattern 210Am and as compared to corresponding locations within the known pattern 210A, unmodified and modified fill shape locations can be associated with first and second data values, respectively. That is, all fill shape locations within the coded pattern 210Am except for the modified fill shape locations $211_3$ and $211_{18}$ (which have replacement fill shapes) can be associated with a first data value (e.g., 0) and the modified fill shape locations $211_3$ and $211_{18}$ (again which have replacement fill shapes) can be associated with a second data value (e.g., 1). In this case, the coded pattern 210Am is decodable into a binary integer with twenty-three bit positions and, particularly, into the following binary integer [00100000000000001000000]. In other embodiments, each fill shape location within a specific section (e.g., see section 212) in the known pattern 210A can be associated with a different bit position in the binary integer. Thus, within this same section 212 in the coded pattern 210Am and as compared to corresponding locations within the known pattern 210A, unmodified and modified fill shape locations can be associated with first and second data values, respectively. That is, all fill shape locations with the section 212 in the coded pattern 210Am except for the modified fill shape locations $211_3$ and $211_{18}$ (which have replacement fill shapes) can be associated with a first data value (e.g., 0) and the modified fill shape locations $211_3$ and $211_{18}$ (again which have replacement fill shapes) can be associated with a second data value (e.g., 1). In this case, the coded pattern 210Am is decodable into a binary integer with seven bit positions and, particularly, into the following binary integer [0100001].

Also, for example, chip structure 300 of FIG. 3 includes a first pattern 310A of fill shapes in a first area (e.g., as indicated by coordinates 1:2), a second pattern 310B of fill shapes in a second area (e.g., as indicated by coordinates 1:3), and a coded pattern 310Am of fill shapes in a third area (e.g., as indicated by coordinates 3:3). For purposes of illustration, the fill shapes in the first pattern 310A and in the second pattern 310B are shown as having a group of three parallel rectangular shapes (per each fill shape). Within the first and second patterns 310A and 310B, these groups of parallel rectangular shapes can be arranged in rows and columns and, within each row of fill shapes and each column of fill shapes, the orientation of the groups of three parallel rectangle shapes can alternate between being oriented in a first direction (e.g., essentially horizontally, as illustrated in the drawing) and being in a second direction that is different from the first direction, such as essentially perpendicular to the first direction (e.g., oriented essentially vertically, as illustrated in the drawings) or otherwise different from the first direction. As illustrated, the fill shapes within the first and second patterns have sizes and densities (i.e., different numbers of fill shapes with an area of the same size). The coded pattern 310Am is a modified instance of the first pattern 310A. Specifically, as illustrated, the first pattern 310A has an arrangement of twenty-four fill shapes in four rows and six columns and at locations $311_1$-$311_{24}$. The coded pattern 310Am is a modified instance of this first pattern 310A in that it has essentially the same particular arrangement of fill shapes in four rows and six columns except that some of the fill shapes at some locations (e.g., see locations $311_2$ and $311_{17}$) have been rotated as compared to the fill shapes at the corresponding locations in the first pattern 310A, thereby disrupting the arrangement of fill shapes with alternating orientations in a first direction (e.g., a horizontal orientation) and a second direction (e.g., a vertical orientation).

In this case, the coded pattern 310Am can be decodable into a binary integer based on differences between the coded pattern 310A and that known pattern 310A at the corresponding locations $311_2$ and $311_{17}$ in the two patterns. For example, in some embodiments, each fill shape location $311_1$-$311_{24}$ in the known pattern 310A can be associated with a different bit position in the binary integer. Thus, within the coded pattern 310Am and as compared to corresponding locations within the known pattern 310A, unmodified and modified fill shape locations can be associated with first and second data values, respectively. That is, all fill shape locations within the coded pattern 310Am except for the modified fill shape locations $311_2$ and $311_{17}$ (where the fill shapes have been rotated) can be associated with a first data value (e.g., 0) and the modified fill shape locations $311_2$ and $311_{17}$ (again where the fill shapes have been rotated) can be associated with a second data value (e.g., 1). In this case, the coded pattern 310Am is decodable into a binary integer with twenty-four bit positions and, particularly, into the following binary integer [010000000000000010000000]. In other embodiments, each fill shape location within a specific section (e.g., see section 312) in the known pattern 310A can be associated with a different bit position in the binary integer. Thus, within this same section 312 in the coded pattern 310Am and as compared to corresponding locations within the known pattern 310A, unmodified and modified fill shape locations can be associated with first and second data values, respectively. That is, all fill shape locations with the section 312 in the coded pattern 310Am except for the modified fill shape locations $311_2$ and $311_{17}$ (where fill shapes have been rotated) can be associated with a first data value (e.g., 0) and the modified fill shape locations $311_2$ and $311_{17}$ (again where fill shapes have been rotated) can be associated with a second data value (e.g., 1). In this case, the coded pattern 310Am is decodable into a binary integer with twelve bit positions and, particularly, into the following binary integer [100000000001].

For purposes of illustration, in the examples provided above, the first data value is a 0 and the second data value is a 1. It should be understood that these examples are not intended to be limiting and that, alternatively, the first data value could be a 1 and the second data value could be a 0. Additionally, for purposes of illustration, in the examples provided above, the area within which the coded pattern is location is indicated by coordinates 3:3. It should be understood that the specific area within which the coded pattern is located can be a randomly selected area.

With the disclosed chip structure embodiments (e.g., the chip structure 100 of FIG. 1, 200 of FIG. 2, 300 of FIG. 3, etc.), the location of the specific area containing the coded pattern, the decode cipher, and the binary integer can be maintained in a database (e.g., a steganography database) as proprietary information of a technology company that owns and/or designed the chips using a process design kit (PDK) of a semiconductor foundry or as proprietary information of the semiconductor foundry that manufactured the chips. Chip authentication can be made by a party with that proprietary information. For example, chip authentication can be made based on both the presence of a coded pattern in the specific area of the chip as well as the accuracy of the decoded binary integer (i.e., does it match the expected binary integer that functions as a chip identifier). Alternatively, the binary integer could be a means of conveying some confidential information to a party that has been provided with the decode cipher and the location of the specific area on the chip that includes the coded pattern.

Figure 4B:
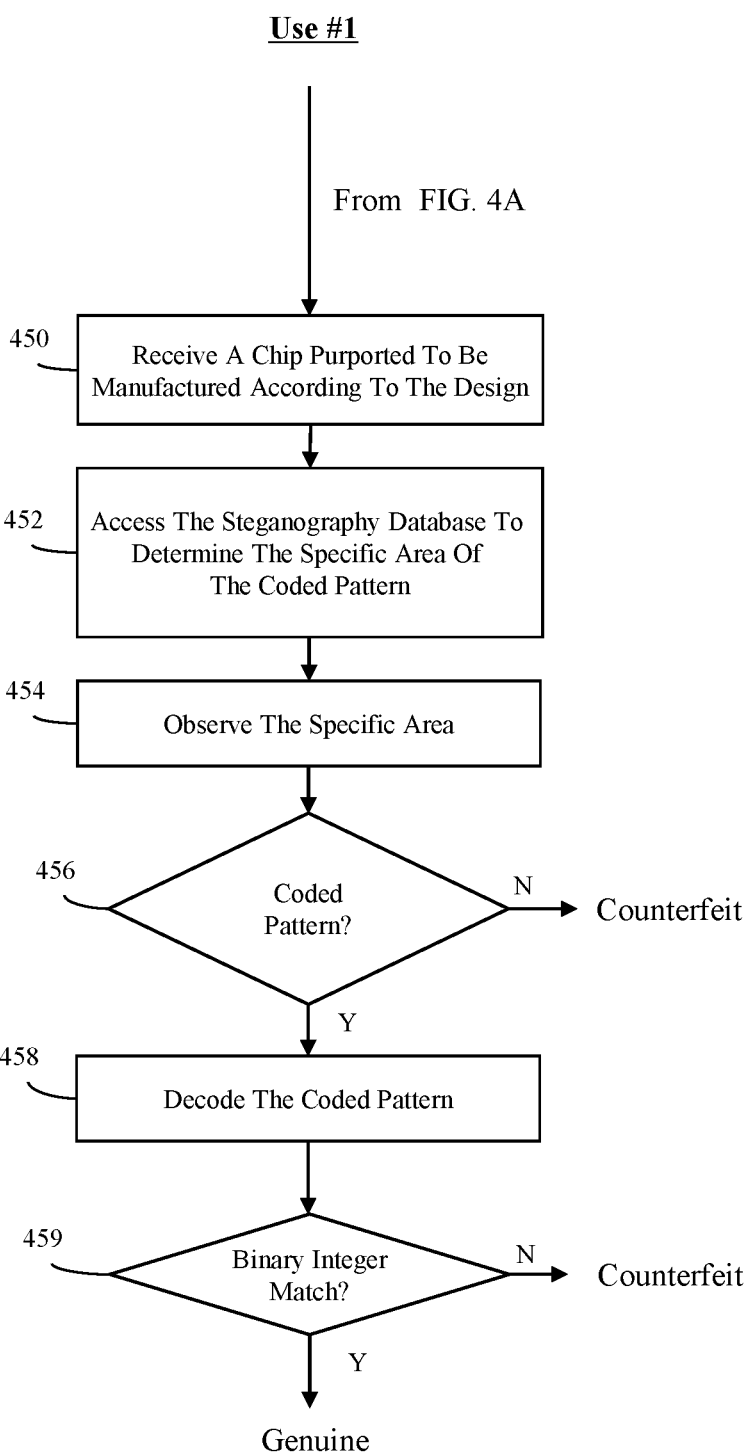
Figure 4C:
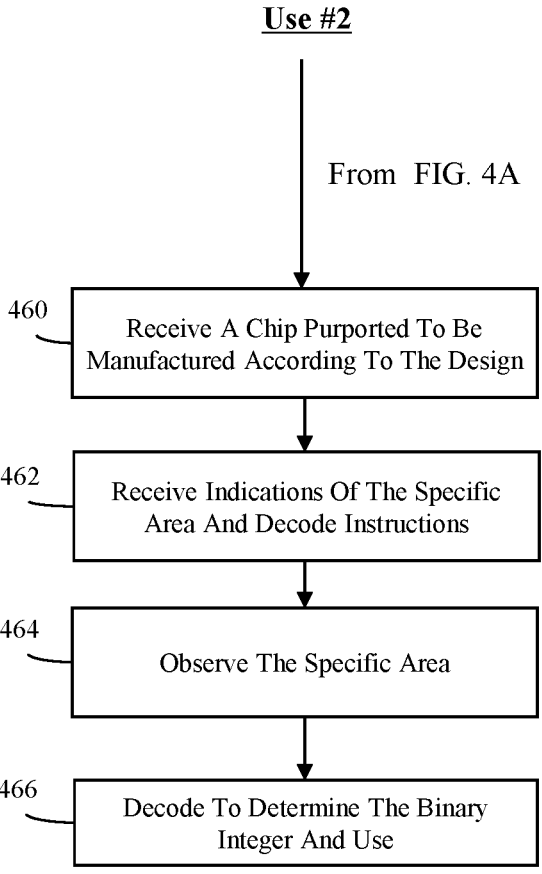

Referring to the flow diagram of FIGS. 4A-4C, also disclosed herein are method embodiments for designing, manufacturing, and using chips that have a coded pattern of fill shapes including steganographically embedded information, as described above. For purposes of illustration, the method is described below and illustrated in the figures with respect to designing, manufacturing, and using chips having the chip structure 100 shown in FIG. 1 and described in detail above. It should be understood that essentially the same process steps could be employed for designing, manufacturing, and using any of the other above-described chips structures (e.g., the chip structure 200 of FIG. 2 or the chip structure 300 of FIG. 3). FIG. 4A is specifically directed to processes for designing and manufacturing such a chip structure and FIGS. 4B and 4C are directed to different uses of the coded pattern therein.

Figure 5:
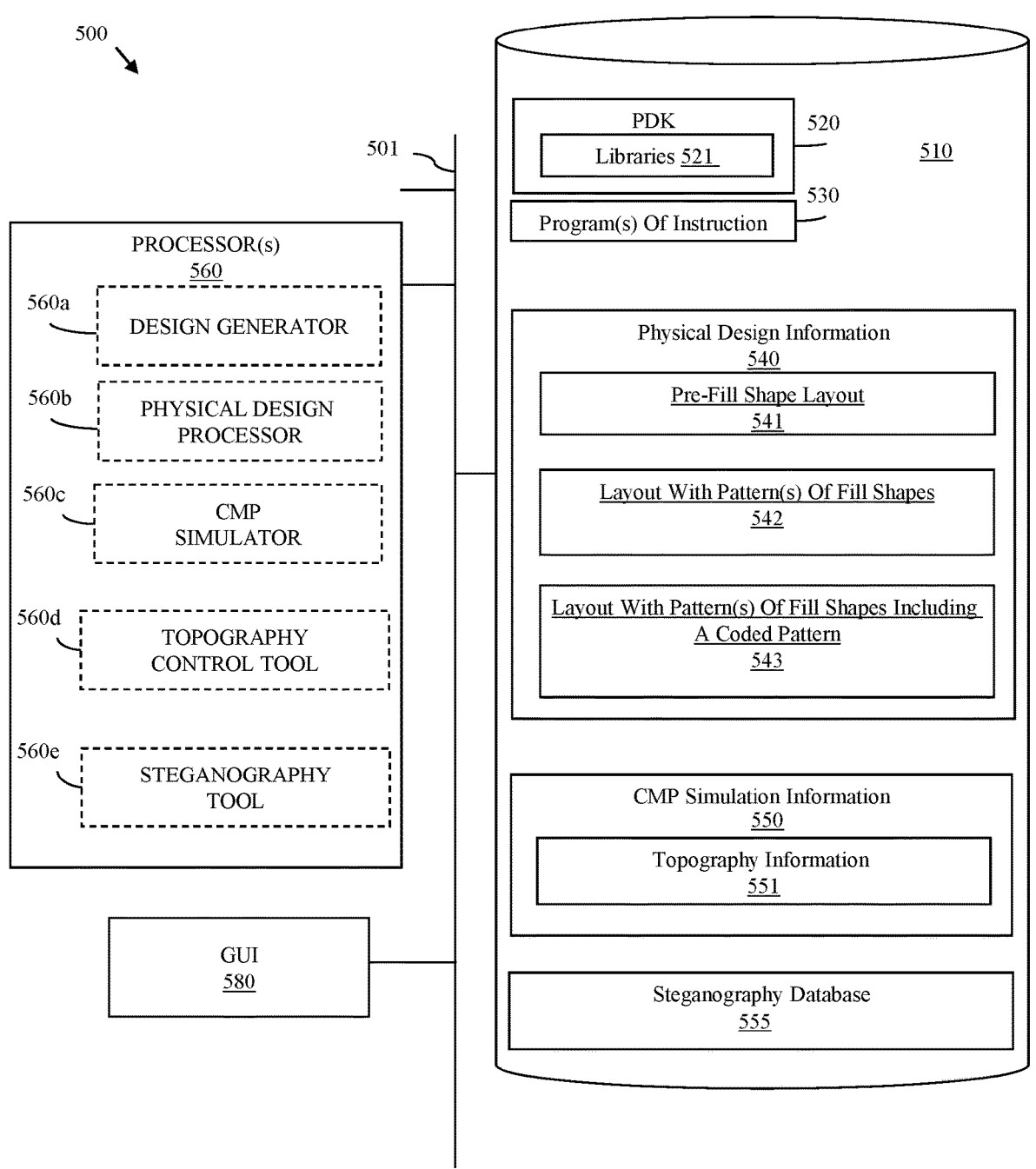
FIG. 5 is a schematic diagram illustrating embodiments of a system for designing the disclosed chip structure embodiments.

The design method shown in FIG. 4A can, for example, be implemented using a design system 500, as shown in FIG. 5. Referring to the FIG. 5, the design system 500 can be a computer-aided design (CAD) system and, specifically, can incorporate at least one memory 510 (e.g., at least one computer readable storage medium, such as a computer readable storage device), a user interface 580 (e.g., a graphic user interface (GUI)) and at least one processor 560. Components of the design system 500, including the processor(s), memory(ies) and GUI, can be interconnected over a system bus 501, as illustrated. Alternatively, any one or more of the components of the design system 500 can communicate with any other component over a wired or wireless network. Memory 510 can store program(s) 530 of instruction (e.g., electronic design automation (EDA) tool(s)) for performing the various design processes described in detail below. The memory 510 can further store, for example, a process design kit (PDK) 520. This PDK 520 can include a set of foundry-specific files including, but not limited to, technology files for a specific technology node, various libraries 521 (e.g., a device library, a patterns of fill shapes library, etc.), design rules, etc. PDKs are known in the art and, thus, the details thereof have been omitted from this specification to allow the reader to focus on the disclosed embodiments.

As mentioned above, the design system 500 can incorporate at least one processor 560. Specifically, the design system 500 can incorporate a single specialized processor 560 (e.g., a single specialized computer processing unit) that, during chip design, performs (i.e., that is adapted to perform, that is configured to perform and/or that executes program(s) 530 of instructions to perform) multiple process steps, as described in detail below with regard to the design method. Alternatively, the design system 500 can incorporate two or more specialized processors (e.g., see processors 560a, 560b, 560c, 560d, 560e, etc.) and, during chip design, each processor can perform (i.e., can be adapted to perform, can be configured to perform and/or can execute one or more specific programs 530 of instructions to perform) one or more of the multiple process steps, as described in detail below with regard to the method. For purposes of illustration, five different special purpose processors are shown in FIG. 5 including a design generator 560a, a physical design processor 560b, a chemical mechanical planarization (CMP) simulator 560c, a topography control tool 560d (also referred to herein as a topography optimizer or fill generator), and a steganography tool 560e. It should be understood that FIG. 5 is not intended to be limiting and, additional special purpose processors could be incorporated into the design system 500 and/or the multiple process steps, as described in detail below, could be performed by any number of one or more processors.

Referring to the flow diagram of FIG. 4A in combination with the design system 500 of FIG. 5, the design method can include receiving, by the design system 500 via the GUI 580, design inputs (e.g., design and performance specifications) for a chip structure. The design inputs can be stored in memory 510 (e.g., on a data storage device accessible by the processor(s)).

The design method can further include developing an initial design for the chip structure based on the design inputs (see process 402). Development of the initial design at process 402 can be performed automatically (e.g., by processor 560 or, if applicable, a design generator 560a executing a program of instructions), based on designer selections and/or inputs (e.g., through GUI 580), or based on a combination of automatic operations and designer selections and/or inputs. The initial design developed at process 402 can be stored in memory 510.

Figure 6:
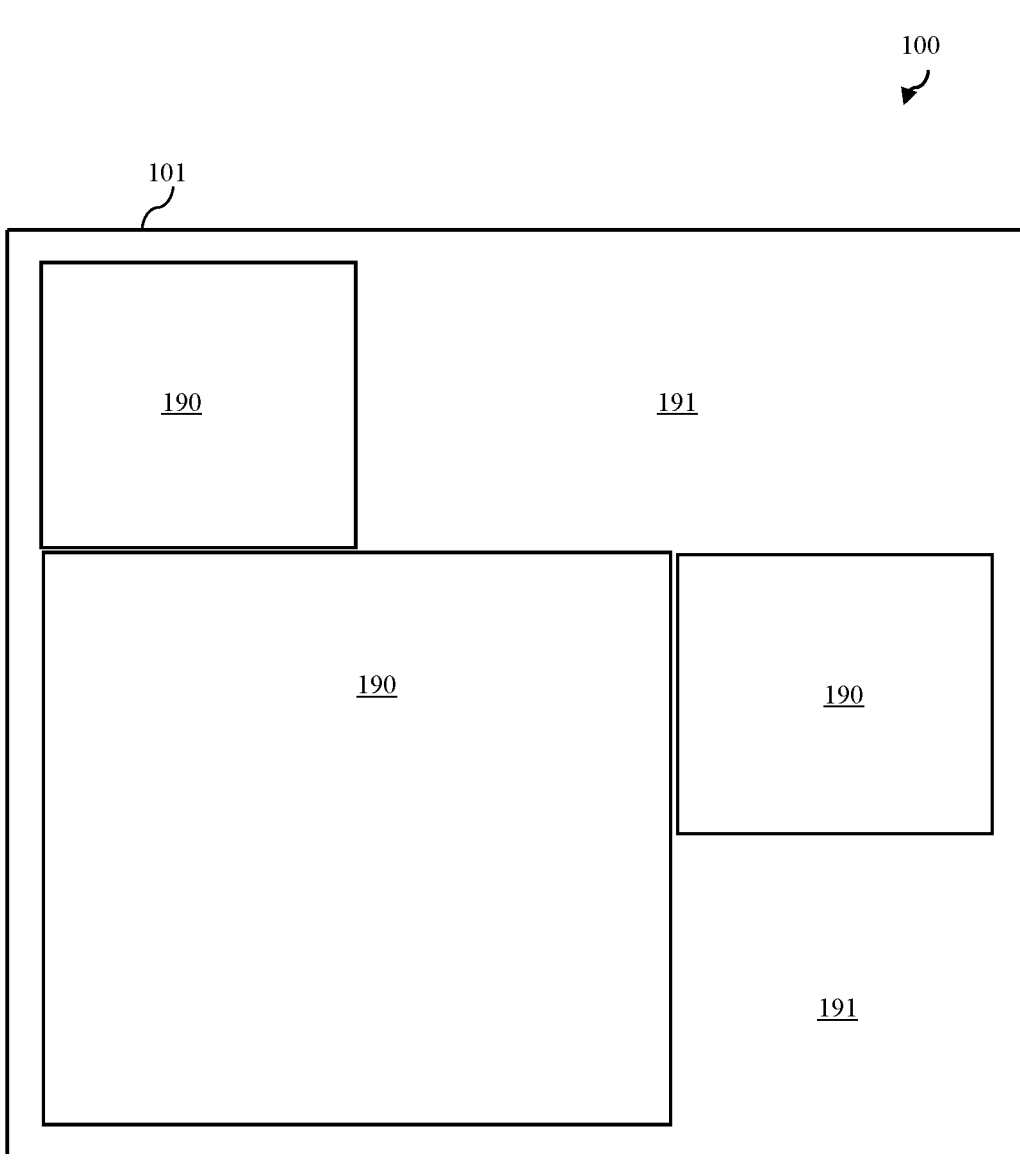
FIGS. 6 and 7 are layout diagrams illustrating design processes performed according to the flow diagram of FIG. 4A.

The design method can further include performing physical design processes to generate a layout for the initial design (see process 404). Physical design can be performed at process 404 automatically (e.g., by processor 560 or, if applicable, a physical design processor 560b executing a program of instructions), based on designer selections and/or inputs (e.g., through GUI 580), or based on a combination of automatic operations and designer selections and/or inputs. Physical design at process 404 can include, but is not limited to, library element selection and placement, wire routing, and layout generation. Physical design information 540 generated at process 404 can include the initial layout 541 for the chip structure in a binary database file format (e.g., GDS, GDSII, OASIS or any other binary database file format) used data exchange of electronic design automation (EDA) artwork) and can be stored in memory 510. FIG. 6 is illustrative of a portion of a chip layout generated at process 404 including a BEOL layer above a substrate 101 and including some areas 190 containing metal or metal alloy interconnects (e.g., wires and/or vias) and other areas 191 that are essentially devoid of such features.

The method can further include accessing the layout generated at process 404 and updating this layout to include patterns of fill shapes (also referred to herein as patterns of dummy fill shapes), where, within the updated layout, the patterns of fill shapes include at least one coded pattern with steganographically embedded information. Thus, chips subsequently manufactured according to the updated layout include the at least one coded pattern.

Figure 7:
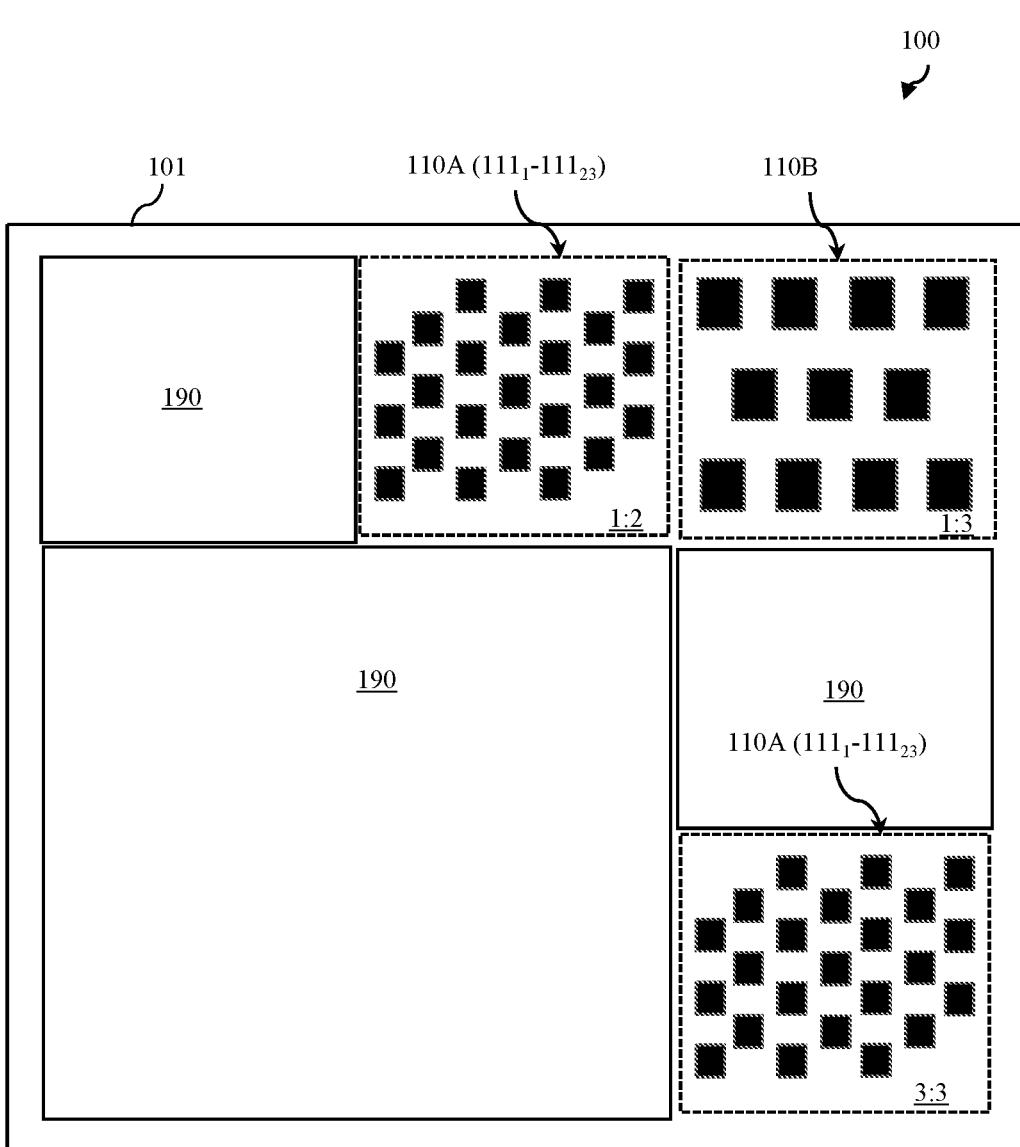

For example, the design method can further include performing topography control (also referred to herein as topography optimization) (see process 406). Specifically, chemical mechanical planarization (CMP) simulation processes can be performed at process 406 (e.g., by processor 560 or, if applicable, CMP simulator 560c executing a program of instructions) for various layers in the layout to determine across-chip surface topography associated with each of the layers. CMP simulation can predict dishing of BEOL metallic features (e.g., wires and vias) and/or erosion of BEOL dielectrics within a BEOL layer due to CMP and, thereby can predict thickness variations across the BEOL layer. CMP information 550 including, but not limited to, the topography information 551 generated during CMP simulation can be stored in memory 510. Topography control at process 406 can further include insertion of one or more patterns of fill shapes (also referred to as dummy fill shapes) into at least one layer (e.g., into a BEOL layer). Insertion of the pattern(s) of fill shapes into a layer at process 406 can be performed (e.g., by processor 560 or, if applicable, by a topography control tool 560d executing a program of instructions). Insertion of the pattern(s) of fill shapes into a layer at process 406 can be performed to control the post-CMP topography of that layer (e.g., to minimize thickness variations due to CMP and, thereby achieve a layer with an essentially uniform across-chip thickness). The pattern(s) of fill shapes can be either selected from a library of patterns of fill shapes (see libraries 521) or custom-designed and then inserted into the layout. Thus, process 406 can include generating an updated layout 542 for the chip (e.g., in the binary database file format, as described above) such that it includes one or more pattern(s) of fill shapes and further storing the updated layout 542 in memory 510. FIG. 7 is illustrative of a portion of an updated chip layout generated at process 406 including a BEOL layer above a substrate 101 with some areas 190 containing metal or metal alloy interconnects (e.g., wires and/or vias) and other areas containing patterns of fill shapes (e.g., see the two instances of a first pattern 110A of fill shapes and the one instance of a second pattern 110B of fill shapes).

The design method can further include steganographically embedding information into at least one of the pattern(s) of fill shapes to create at least one coded pattern in a specific area of the chip (see process 408). Steganograpically embedding information into the pattern can be performed at process 408 (e.g., by processor 560 or, if applicable, steganography tool 560c executing a program of instructions) and can include selecting a pattern to be modified from the updated layout 542. Selection of the pattern at process 408 can be essentially random or arbitrary so that the presence and location of the coded pattern created at process 408 will not be readily detectable without access to proprietary information including the specific area (e.g., as indicated, for example, by some defined coordinates). Creation of the coded pattern at process 408 can further include modifying the selected pattern according to a specific steganographic technique (as discussed further below). Yet another updated layout 543 for the chip (e.g., in the binary database file format, as described above) with pattern(s) of fill shapes including the coded pattern can be generated and the updated layout 543 can be stored in memory 510. Thus, the coded pattern is a modified instance of a known pattern (i.e., the selected pattern in the specific area which was previously inserted into the layout). Such a coded pattern can be decodable into a binary integer as a function of observable differences between the coded pattern and that known pattern at corresponding locations in the two patterns. It should be understood that observable differences include differences between the coded pattern and the known pattern that are at least observable through inspection by a scanning electron microscope (SEM). Various different techniques can be employed to modify the selected pattern in order to steganographically embed information.

Steganographic technique A can include removing one or more of the fill shapes at one or more fill shape locations in the selected pattern. For example, the first pattern 110A located at the coordinates 3:3 and shown in FIG. 6 can be selected and modified to create coded pattern 110Am at coordinates 3:3 by removing some of the fill shapes at some of the fill shape locations (e.g., see locations $111_3$ and $111_{18}$) within the selected pattern (e.g., see the resulting chip structure 100 shown in FIG. 1). This coded pattern 110Am can be decodable into a binary integer based on differences between the coded pattern 110Am and the known pattern 110A at the corresponding locations $111_3$ and $111_{18}$ in the two patterns, as discussed in greater detail above with regard to the chip structure 100 of FIG. 1.

Steganographic technique B can include replacing one or more of the fill shapes in one or more of the fill shape locations in the selected pattern (e.g., with fill shape(s) having different shapes or sizes). This steganographic technique B can, for example, result in the chip structure 200 shown in FIG. 2 and described in greater detail above where the coded pattern 210Am is a modified instance of the first pattern 210A. This coded pattern 210Am can be decodable into a binary integer based on differences between the coded pattern 210A and that known pattern 210A at the corresponding locations $211_3$ and $211_{18}$ in the two patterns, as discussed in greater detail above with regard to the chip structure 200 of FIG. 2.

Steganographic technique C can be applied to patterns of fill shapes that include fills shapes having some observable orientation. The fill shapes could be oriented in a first direction (e.g., horizontal orientation) or a second direction (e.g., a vertical orientation) and the steganographic technique C can include rotating one or more of the fill shapes at one or more of the fill shape locations in the selected pattern. This steganographic technique C can, for example, result in the chip structure 300 shown in FIG. 3 and described in greater detail above where the coded pattern 310Am is a modified instance of the first pattern 310A. This coded pattern 310Am can be decodable into a binary integer based on differences between the coded pattern 310A and that known pattern 310A at the corresponding locations $311_2$ and $311_{17}$ in the two patterns, as discussed in greater detail above with regard to the chip structure 300 of FIG. 3.

It should be noted that processes 406-408 can be performed at the customer-level. That is, they can be performed by a design system employed by a customer (e.g., a technology company) using a PDK provided by a semiconductor foundry. Updated layout 543 with pattern(s) of fill shapes including at least one coded pattern can subsequently be provided to the semiconductor foundry, which can perform any final design processing and release the final design to tape output for manufacturing of chips according to the final design (see process 414).

Alternatively, a customer (e.g., a technology company) can generate and store the updated layout 542 with the inserted pattern(s) of fill shapes at process 406 and provide the updated layout 542 to a semiconductor foundry. The semiconductor foundry (as opposed to the customer) can then steganographically embed information into a selected one of the patterns at process 408 to create the coded pattern. The semiconductor foundry can subsequently perform any final design processing and release the final design to tape output for manufacturing of chips according to the final design (see process 414).

Alternatively, process 408 can be performed at the customer-level (e.g., by a technology company) to generate at least one first coded pattern (specific to the customer) and then again at the foundry-level (i.e., by the semiconductor foundry that will manufacture the chips) to generate at least one second coded pattern (specific to the foundry). Thus, prior to manufacturing, the updated layout will include at least two coded patterns, one created by the customer and another created by the semiconductor foundry. The semiconductor foundry can subsequently perform any final design processing and release the final design to tape output for manufacturing of chips according to the final design (see process 414).

It should be noted that processes 406-408 are described above and illustrated in the flow diagram for illustration purposes and are not intended to be limiting. That is, as described, the updated layout with the patterns of dummy fill shapes including at least one coded pattern could be created by inserting patterns of fill shapes into a layout during topography control and then modifying a randomly or arbitrarily selected one of those patterns to create the coded pattern. However, these exemplary processes are not intended to be limiting. Alternatively, during topography control, a coded pattern with steganographically embedded information could be inserted into the layout along with other uncoded patterns. For example, the library of patterns of fill shapes could include uncoded patterns of fill shapes and also some coded patterns with steganographically embedded information (i.e., patterns that were previously coded according to any of the above-described steganographic techniques A, B, or C or some other suitable steganographic technique and stored in the library). Then, during topography control, at least one of the patterns selected from the library and inserted into the layout (i.e., to generate the updated layout) could be a coded pattern with steganographically embedded information.

In any case, any party that updates a layout to include at least one coded pattern of fill (e.g., a customer, a foundry, or both) can associate the chip structure with the location of the specific area on the chip containing the coded pattern, with the decode cipher, and with the binary integer in a database (e.g., a steganography database 555) and can maintain that database as proprietary information (see process 412). Such a coded pattern of fill shapes on a manufactured chip could have various different uses, as illustrated in the flow diagrams of FIGS. 4B and 4C and described in greater detail below.

For example, referring to the flow diagram of FIG. 4B, the coded pattern of fill shapes on a manufactured chip could be used for chip authentication. Chip authentication can be made by a party having access to the proprietary information mentioned above and stored in the steganography database. For example, a chip purported to be manufactured according to a chip design at issue can be received by a party (see process 450). The party can access steganographic database 555 to determine the location of the specific area that should contain the coded pattern and to also acquire the decode cipher and the expected binary integer (see process 452). The party can further observe and, particularly, inspect the specific area of the chip (e.g., through a scanning electron microscope (SEM) or by viewing or otherwise analyzing images generated by such a SEM) (see process 454). The specific area can be evaluated to determine if it includes a coded pattern (see process 456). If not, the chip can be deemed a counterfeit chip. If so, the coded pattern can be decoded into a binary integer, using the decode cipher acquired from the steganography database (see process 458). The decoded binary integer can then be compared to the expected binary integer acquired from the steganography database to determine if they match (see process 459). If not, the chip can be deemed a counterfeit chip. If so, the chip can be deemed a genuine (i.e., authentic chip).

Referring to the flow diagram of FIG. 4C, alternatively, the coded pattern of fill shapes on a manufactured chip could be used as a means of conveying some confidential information to a party that has been provided with the decode cipher and the location of the specific area on the chip that includes the coded pattern. For example, a chip purported to be manufactured according to a chip design at issue can be received by a party (see process 460). The party can also receive at least some of the information stored in the database (e.g., from the foundry) including: the location of the specific area that should contain a coded pattern and the decode cipher for the coded pattern (see process 462). The party can further observe and, particularly, inspect the coded pattern in the specific area of the chip (e.g., through a scanning electron microscope (SEM) or by viewing or otherwise analyzing images generated by such a SEM) (see process 464). The coded pattern can then be decoded into a binary integer using the decode cipher (see process 466). The binary integer can, for example, contain encrypted data that can subsequently be used by the party receiving it.

Aspects of the disclosed embodiments be implemented as systems, methods, and/or computer program products. A computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
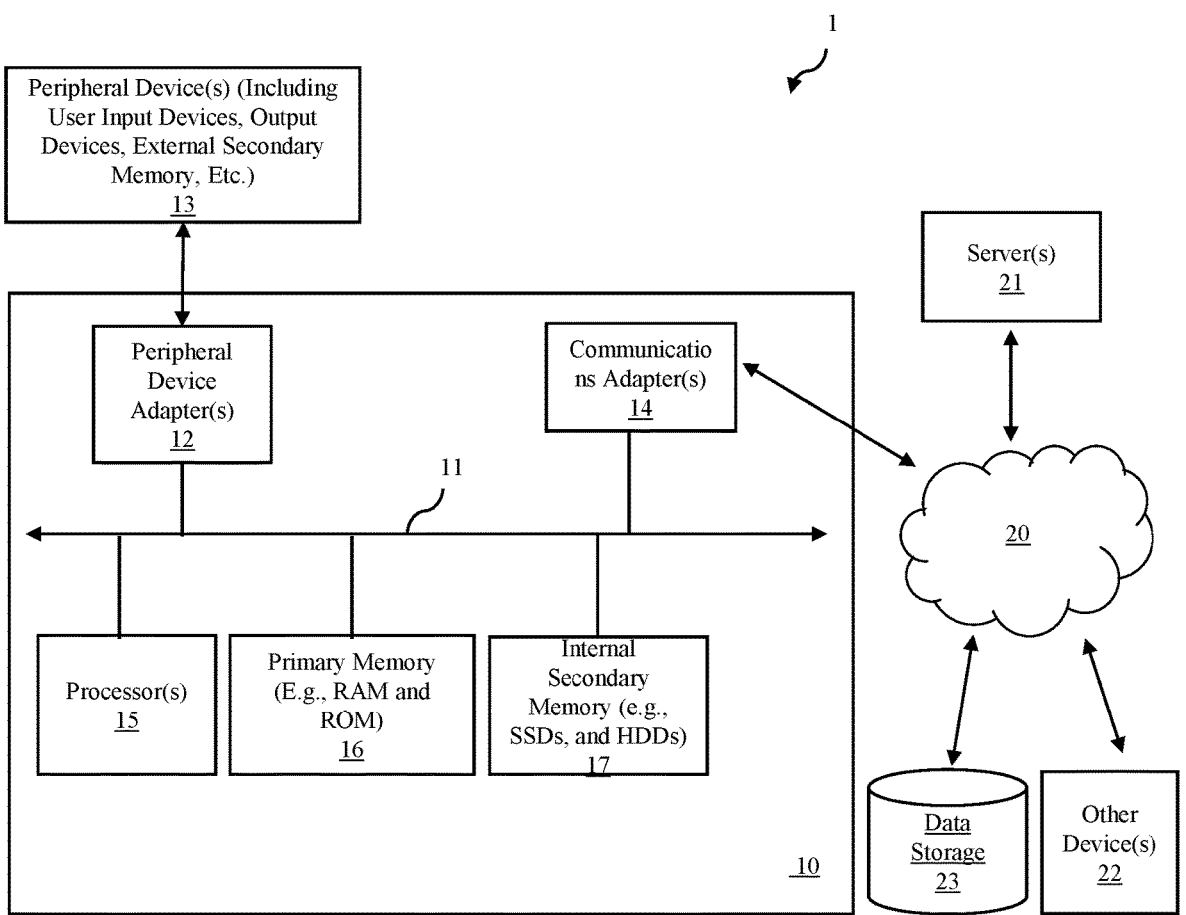
FIG. 8 is a schematic diagram illustrative of a hardware environment for implementing aspects of the disclosed embodiments.

An illustrative hardware environment 1 for implementing aspects of the disclosed systems, methods, and computer program products is depicted in FIG. 8. Generally, the hardware environment can include at least one computing device 10 (also referred to herein as a computer). Computer 10 can be, for example, a desktop, laptop, tablet, mobile computing device, etc. Computer 10 can include at least one bus 11. Bus 11 can be connected to various other components of the computer 10 and can be configured to facilitate communication between those components.

Computer 10 can include various adapters. The adapters can include one or more peripheral device adapters 12, which are configured to facilitate communications between one or more peripheral devices 13, respectively, and the bus 11. Peripheral devices 13 can include user input devices configured to receive user inputs. User input devices can include, but are not limited to, a keyboard, a mouse, a microphone, a touchpad, a touchscreen, a stylus, biosensor, a scanner, or any other type of user input device. Peripheral devices 13 can also include additional input devices, such as external secondary memory devices (as discussed in greater detail below). Peripheral devices 13 can also include output devices. The output devices can include, but are not limited to, a printer, a monitor, a speaker, or any other type of computer output device. The adapters can include one or more communications adapters 14 (also referred to herein as a computer network adapters), which are configured to facilitate communications between the computer 10 and one or more communications networks 20 (e.g., a wide area network (WAN), a local area network (LAN), the internet, a cellular network, a Wi-Fi network, etc.). Such network(s) 20 can, in turn, facilitate communications between the computer 10 and other system components on the network: remote server(s) 21, other device(s) 22 (e.g., computers, laptops, tablets, mobile phones, etc.), remote data storage 23, etc.

Computer 10 can further include at least one processor 15 (also referred to herein as a central processing unit (CPU)). Optionally, each CPU 15 can include a CPU cache. Each CPU 15 can be configured to read and execute program instructions.

Computer 10 can further include memory and, particularly, computer-readable storage mediums. The memory can include primary memory 16 and secondary memory. The primary memory 16 can include, but is not limited to, random access memory (RAM) (e.g., volatile memory employed during execution of program operations) and read only memory (ROM) (e.g., non-volatile memory employed during start-up). The RAM can include, but is not limited to, dynamic random access memory (DRAM), static random access memory (SRAM), or any other suitable type of RAM. The ROM can include, but is not limited to, erasable programmable read only memory (EPROM), flash memory, electronically erasable programmable read only memory (EEPROM), programmable read only memory (PROM), or any other suitable type of ROM. The secondary memory can be non-volatile. The secondary memory can include internal secondary memory 17, such as internal solid state drive(s) (SSD(s)) and/or internal hard disk drive(s) (HDD(s), installed within the computer 10 and connected to the bus 11. The secondary memory can also include external secondary memory connected to or otherwise in communication with the computer 10 (e.g., peripheral devices). The external secondary memory can include, for example, external/portable SSD(s), external/portable HDD(s), flash drive (s), thumb drives, compact disc(s) (CD(s)), digital video disc(s) (DVD(s)), network-attached storage (NAS), storage area network (SAN), or any other suitable non-transitory computer-readable storage media connected to or otherwise in communication with the computer 10. The different functions of primary and secondary memory are well known in the art and, thus, the details thereof have been omitted from this specification in order to allow the reader to focus on the salient aspects of the disclosed embodiments.

In some embodiments, program instructions for performing the disclosed method or a portion thereof, as described above, can be embodied in (e.g., stored in) secondary memory accessible by computer 10. When the program instructions are to be executed (e.g., in response to user inputs to the computer 10), required information (e.g., the program instructions and other data) can be loaded into the primary memory (e.g., stored in RAM). The CPU 15 can read the program instructions and other data from the RAM and can execute the program instructions. In other embodiments, a client-server model can be employed. In this case, the computer 10 can be a client and a remote server 21 in communication with the computer 10 over a network 20 can provide, to the client, a service including execution of program instructions for performing the disclosed method or a portion thereof, as described above, in response to user inputs the computer 10.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a chip including:
        a substrate;
        metal levels on the substrate; and
        patterns of fill shapes, wherein the fill shapes are within the metal levels, and wherein the patterns include at least one coded pattern with steganographically embedded information.

2. The structure of claim 1, wherein the coded pattern includes a modified instance of a known pattern and wherein the coded pattern is decodable into a binary integer as a function of observable differences between the coded pattern and the known pattern at corresponding locations.

3. The structure of claim 2, wherein the coded pattern is missing at least one fill shape from at least one location as compared to a corresponding location in the known pattern.

4. The structure of claim 2, wherein the coded pattern has at least one replacement fill shape in at least one location as compared to a corresponding location in the known pattern.

5. The structure of claim 2, wherein the coded pattern has at least one rotated fill shape in at least one location as compared to a corresponding location in the known pattern.

6. The structure of claim 2,
    wherein each fill shape location in the known pattern is associated with a different bit position in the binary integer, and
    wherein, within the coded pattern and as compared to corresponding locations within the known pattern, unmodified and modified fill shape locations are associated with first and second data values, respectively, so the coded pattern is decodable into the binary integer.

7. The structure of claim 2,
    wherein each fill shape location in a specific section of the known pattern is associated with a different bit position in the binary integer, and
    wherein, within the coded pattern and as compared to corresponding locations within the specific section in the known pattern, unmodified and modified fill shape locations are associated with first and second data values, respectively, so the coded pattern is decodable into the binary integer.

8. The structure of claim 1,
    wherein the fill shapes in the patterns include any of:
        metallic fill shapes within trenches in a dielectric layer of the metal levels; and
        dielectric fill shapes embedded within a metallic layer of the metal levels, and
    wherein the fill shapes are electrically isolated and non-functional.

9. A method comprising:
    accessing a layout of a chip including a substrate and metal levels on the substrate; and
    updating the layout to include patterns of fill shapes, wherein the fill shapes are within the metal levels, and wherein the patterns of fill shapes in the updated layout include at least one coded pattern with steganographically embedded information so that chips manufactured according to the updated layout include the at least one coded pattern.

10. The method of claim 9, wherein the updating of the layout includes:
    inserting the patterns into the layout; and
    modifying at least one of known pattern of the patterns to create the coded pattern such that the steganographically embedded information is decodable into a binary integer as a function of observable differences between the coded pattern and the known pattern at corresponding locations.

11. The method of claim 10, wherein the modifying includes removing at least one fill shape from at least one location as compared to a corresponding location in the known pattern.

12. The method of claim 10, wherein the modifying includes replacing at least one fill shape in at least one location as compared to a corresponding location in the known pattern.

13. The method of claim 10, wherein the modifying includes rotating at least one fill shape in at least one location as compared to a corresponding location in the known pattern.

14. The method of claim 10,
    wherein each fill shape location in the known pattern is associated with a different bit position in the binary integer, and
    wherein, within the coded pattern and as compared to corresponding locations within the known pattern, unmodified and modified fill shape locations are associated with first and second data values, respectively, so the coded pattern is decodable into the binary integer.

15. The method of claim 10, wherein each fill shape location in a specific section of the known pattern is associated with a different bit position in the binary integer, and wherein, within the coded pattern and as compared to corresponding locations within the specific section in the known pattern, unmodified and modified fill shape locations are associated with first and second data values, respectively, so the coded pattern is decodable into the binary integer.

16. The method of claim 10, wherein the fill shapes in the patterns include any of:

metallic fill shapes within trenches in a dielectric layer of the metal levels; and dielectric fill shapes embedded within a metallic layer of the metal levels, and wherein the fill shapes are electrically isolated and non-functional.

17. A method comprising:

inspecting a coded pattern of fill shapes in a specific area of a chip, wherein the coded pattern includes steganographically embedded information; and decoding the coded pattern into a binary integer.

18. The method of claim 17, wherein the decoding of the pattern into the binary integer is performed using a decode cipher.

19. The method of claim 18, further comprising determining authenticity of the chip by comparing the binary integer to an expected binary integer.

20. The method of claim 18, further comprising receiving conveyed information through the binary integer.

* * * * *